(12) United States Patent
Balz

(10) Patent No.: US 12,199,593 B2
(45) Date of Patent: Jan. 14, 2025

(54) CIRCUIT ARRANGEMENT FOR A CONTROL UNIT OF A VEHICLE

(71) Applicant: Robert Bosch GmbH, Stuttgart (DE)

(72) Inventor: Stefan Balz, Besigheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 58 days.

(21) Appl. No.: 18/322,225

(22) Filed: May 23, 2023

(65) Prior Publication Data

US 2023/0412164 A1    Dec. 21, 2023

(30) Foreign Application Priority Data

Jun. 21, 2022   (DE) ..................... 10 2022 206 160.8

(51) Int. Cl.
    *H03K 17/00*      (2006.01)
(52) U.S. Cl.
    CPC .................................. *H03K 17/002* (2013.01)
(58) Field of Classification Search
    CPC ........... G11C 7/1066; G11C 7/00; G11C 7/10; G11C 7/222; H03K 5/135; H03K 5/1534
    USPC ................................................. 327/345, 564
    See application file for complete search history.

(56) References Cited

U.S. PATENT DOCUMENTS 5,968,100 A  * 10/1999 Kayano ............... B60R 16/0315
                                                       701/1

FOREIGN PATENT DOCUMENTS

DE           19524838 A1    1/1996
DE       102016208181 A1   11/2017

* cited by examiner

*Primary Examiner* — Hai L Nguyen
(74) *Attorney, Agent, or Firm* — NORTON ROSE FULBRIGHT US LLP; Gerard A. Messina

(57) ABSTRACT

A circuit arrangement for a control unit of a vehicle. The circuit arrangement includes at least one ASIC component, which comprises at least one analog input and at least one analog output, and at least one multiplexer which comprises at least one output that is electrically connected to the at least one analog input and at least two inputs and is embodied to electrically connect one of the at least two inputs to the at least one output as a function of at least one control signal. The at least one ASIC component has a multiplexer function which is embodied to generate the at least one control signal and to output the signal via the at least one analog output to at least one control input of the at least one multiplexer. A control unit comprising at least one such circuit arrangement is also described.

7 Claims, 1 Drawing Sheet

CIRCUIT ARRANGEMENT FOR A CONTROL UNIT OF A VEHICLE

CROSS REFERENCE

The present application claims the benefit under 35 U.S.C. § 119 of German Patent Application No. DE 10 2022 206 160.8 filed on Jun. 21, 2022, which is expressly incorporated herein by reference in its entirety.

FIELD

The present invention relates to a circuit arrangement for a control unit of a vehicle. The present invention also includes a control unit for a vehicle comprising at least one such circuit arrangement.

BACKGROUND INFORMATION

In related art control units of vehicles, in particular airbag control units, circuit arrangements are used which comprise at least one highly integrated ASIC component (ASIC: application-specific integrated circuit). Such an ASIC component typically comprises a specific number of analog inputs, for example to read in signals from resistance-based or current-based sensors and/or switches from the vehicle. Such an ASIC component furthermore typically also comprises analog outputs, for example to control drivers of ignition circuits or to control discrete lamps. If the number of integrated analog inputs is insufficient, additional ASIC components can be used. Alternatively, a multiplexer can be connected upstream of the analog inputs of the ASIC component, so that the individual analog inputs can each be used for multiple analog input signals, which can be alternately connected to the respective analog input. Such a multiplexer is typically controlled via the software of an evaluation and control unit of the control unit that is preferably embodied as a microcontroller. This requires synchronizing the control of the multiplexer with the typically highly automated test processes and/or read-in processes of the ASIC component. Analog inputs of the microcontroller can furthermore be used directly as additional analog inputs as well. However, these do not provide sufficient diagnostic capability, so that Hall sensors, for example, to which a defined operating current has to be applied, cannot be used with the analog inputs of the microcontroller to the same extent as with the analog inputs of the ASIC component.

SUMMARY

A circuit arrangement for a control unit of a vehicle having the features of the present invention may have the advantage that at least one analog output of an ASIC component is reconfigured in such a way that it is not controlled as a standard output via a microcontroller, but rather automatically controls a multiplexer in a multiplexer function of the ASIC component in order to thus increase the number of analog inputs available for analog signals. If, for example, an analog output of the ASIC component is used to control the multiplexer, the number of available analog inputs can effectively be doubled. If two analog outputs are used, the number of available analog inputs can be quadrupled. In principle, (2^N) times as many analog signals can be read in as there are analog inputs on the ASIC component, wherein N corresponds to the number of analog outputs used.

Since typically not all of the available analog outputs of the at least one ASIC component are used, they can be used to control the multiplexer. The number of analog inputs of the ASIC component can thus advantageously be reduced. The multiplexer function implemented in the ASIC component can be configured such that the internal processes of the ASIC component for reading in the analog signals can be run through at least one more time and diagnostic functions, too, can be repeated in the same manner. The time-consuming synchronization in the software of an evaluation and control unit of the control unit can moreover be omitted, and possible error states and runtime influences can be avoided.

Example embodiments of the present invention provide a circuit arrangement for a control unit of a vehicle, having at least one ASIC component, which comprises at least one analog input and at least one analog output, and at least one multiplexer, which comprises at least one output that is electrically connected to the at least one analog input and at least two inputs and is embodied to electrically connect one of the at least two inputs to the at least one output as a function of at least one control signal. The at least one ASIC component has a multiplexer function which is embodied to generate the at least one control signal and output said signal via the at least one analog output to at least one control input of the at least one multiplexer.

According to an example embodiment of the present invention, a control unit for a vehicle is provided, which comprises an evaluation and control unit and at least one such circuit arrangement. The evaluation and control unit is connected to at least one control input of an ASIC component of the ASIC circuit arrangement.

The evaluation and control unit can be understood here to be an electronic unit, such as a microcontroller, which processes or evaluates acquired sensor signals. The evaluation and control unit can comprise at least one interface, which can be implemented as hardware and/or software. When implemented as hardware, the interfaces can be part of a so-called system ASIC, for example, which contains various functions of the evaluation and control unit. However, it is also possible that the interfaces are dedicated integrated circuits or consist at least partly of discrete components. When implemented as software, the interfaces can be software modules that are present on the microcontroller, for example, alongside other software modules. Advantageous is also a computer program product comprising program code that is stored on a machine-readable carrier such as a semiconductor memory, a hard disk memory or an optical memory and is used to implement the evaluation when the program is executed by the evaluation and control unit.

Advantageous improvements of the circuit arrangement for a control unit of a vehicle disclosed herein are made possible by the measures and further developments disclosed herein.

According to an example embodiment of the present invention, it is particularly advantageous that the multiplexer function can be further configured to repeatedly activate a read-in function of the at least one analog input until analog signals present at the at least two inputs of the multiplexer are read in. If the multiplexer is embodied as 2:1 multiplexer, for instance, two analog signals can be read in one after the other at one analog input of the ASIC component in two passes of the read-in function. In a 3:1 multiplexer, three analog signals can be read in one after the other at one analog input of the ASIC component in three passes of the read-in function, for example.

In an advantageous configuration of the circuit arrangement of the present invention, the read-in function can include a diagnostic function for error detection. The diagnostic function can, for example, include functions for detecting errors such as shunts (cross-coupling) etc.

In another advantageous configuration of the circuit arrangement of the present invention, the number of outputs of the multiplexer can correspond to the number of analog inputs of the ASIC component. This allows all of the analog inputs to be used to successively read in multiple analog signals. Alternatively, the multiplexer can be used for only a specific number of analog inputs of the ASIC component to successively read in multiple analog signals.

In another advantageous configuration of the circuit arrangement of the present invention, the number of inputs, which can be sequentially electrically connected to the at least one output of the multiplexer and the at least one analog input of the ASIC component can be based on a number of available analog outputs of the ASIC component. If there is only one available analog output of the ASIC component, two inputs of the multiplexer can be sequentially connected to a respective analog output, for example. If there are two available analog outputs of the ASIC component, up to four inputs of the multiplexer can be sequentially connected to a respective analog output.

In another advantageous configuration of the circuit arrangement of the present invention, the multiplexer can be embodied as a discrete transistor network. The multiplexer can alternatively be embodied as an integrated circuit.

Embodiment examples of the present invention and a conventional control unit comprising an ASIC component are shown in the figures and are explained in more detail in the following description. In the figures, the same reference signs designate components or elements that perform the same or analogous functions.

DETAILED DESCRIPTION OF EXAMPLE EMBODIMENTS

Figure 1:
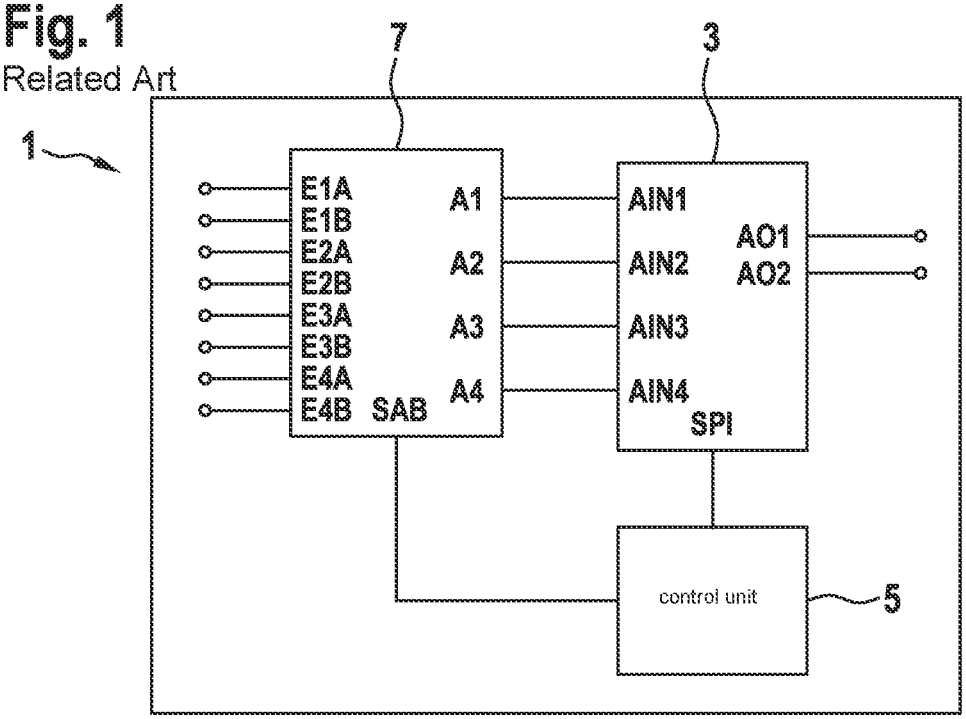
FIG. 1 shows a schematic block diagram of a conventional control unit.

As can be seen from FIG. 1, the shown conventional control unit 1 comprises an ASIC component 3, an evaluation and control unit 5 and a multiplexer 7. As can further be seen from FIG. 1, the ASIC component 3 comprises four analog inputs AIN1, AIN2, AIN3, AIN4, each of which is electrically connected to an output A1, A2, A3, A4 of the multiplexer 7, and two analog outputs AO1, AO2. The multiplexer 7 comprises eight inputs E1A, E2A, E3A, E4A, E1B, E2B, E3B, E4B, of which two inputs E1A, E2A, E3A, E4A, E1B, E2B, E3B, E4B can respectively be connected to one of the four outputs A1, A2, A3, A4 of the multiplexer 7. A control input SAB of the multiplexer 7 and a control input SPI of the ASIC component 3 are connected to the evaluation and control unit 5, so that the evaluation and control unit 5 can control the multiplexer 7 and the ASIC component 3. This requires that the evaluation and control unit 5 synchronizes the control of the multiplexer 7 with the highly automated test processes and read-in processes of the ASIC component 3 in order to respectively connect four first inputs E1A, E2A, E3A, E4A of the multiplexer 7 to one each of the outputs A1, A2, A3, A4 of the multiplexer 7 in a first read-in process and respectively connect four second inputs E1B, E2B, E3B, E4B of the multiplexer 7 to one each of the outputs A1, A2, A3, A4 of the multiplexer 7 in a second read-in process.

Figure 2:
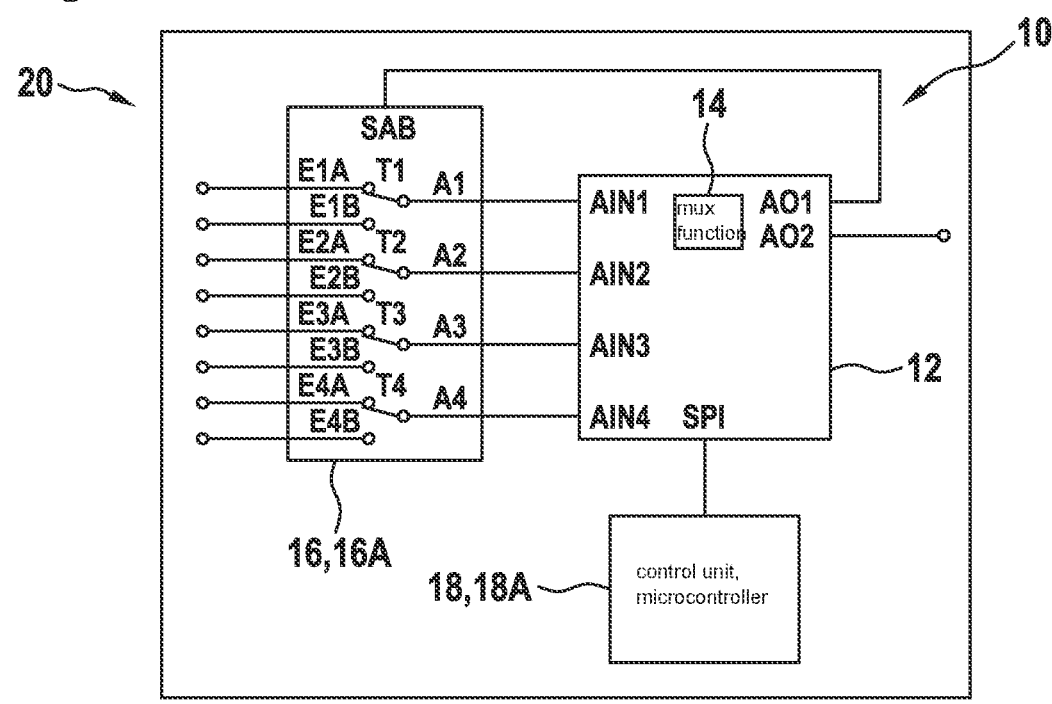
FIG. 2 shows a schematic block diagram of an embodiment example of a control unit according to the present invention for a vehicle with an embodiment example of a circuit arrangement according to the present invention for a control unit of a vehicle.

As can be seen from FIG. 2, the shown embodiment example of a control unit 20 according to the present invention for a vehicle comprises an evaluation and control unit 18 and a circuit arrangement 10 according to the present invention. In the shown embodiment example, the evaluation and control unit 18 is embodied as microcontroller 18A and is connected to at least one control input SPI of an ASIC component 12 of the circuit arrangement 10.

As can further be seen from FIG. 2, the shown embodiment example of the circuit arrangement 10 for a control unit 20 of a vehicle includes at least one ASIC component 12, which comprises at least one analog input AIN1, AIN2, AIN3, AIN4 and at least one analog output AO1, AO2, and at least one multiplexer 16, which includes at least one output A1, A2, A3, A4 that is electrically connected to the at least one analog input AIN1, AIN2, AIN3, AIN4 and at least two inputs E1A, E2A, E3A, E4A, E1B, E2B, E3B, E4B and electrically connects one of the at least two inputs E1A, E2A, E3A, E4A, E1B, E2B, E3B, E4B to the at least one output A1, A2, A3, A4 as a function of at least one control signal. The at least one ASIC component 12 has a multiplexer function 14 which generates the at least one control signal and outputs said signal via the at least one analog output AO1, AO2 to at least one control input SAB of the at least one multiplexer 16.

As can further be seen from FIG. 2, the ASIC component 12 comprises four analog inputs AIN1, AIN2, AIN3, AIN4, each of which is electrically connected to an output A1, A2, A3, A4 of the multiplexer 7, and two analog outputs AO1, AO2, of which a first analog input AO1 is electrically connected to a control input SAB of the multiplexer 16. In the shown embodiment example of the circuit arrangement 10, the multiplexer 16 is embodied as a discrete transistor network 16A comprising four transistors T1, T2, T3, T4 which are schematically illustrated as a switches. The shown four transistors T1, T2, T3, T4 are switched simultaneously via the control signal at the control input SAB. In an alternative, not depicted, embodiment example, the multiplexer 16 is implemented as an integrated circuit.

As can be further seen from FIG. 2, the multiplexer 16 in the shown embodiment example comprises eight inputs E1A, E2A, E3A, E4A, E1B, E2B, E3B, E4B and four outputs A1, A2, A3, A4. A first input E1A and a second input E1B can be connected to a first output A1 via a first transistor T1. Another first input E2A and another second input E2B can be connected to a second output A2 via a second transistor T2. Another first input E3A and another second input E3B can be connected to a third output A3 via a third transistor T3. Another first input E4A and another second input E4B can be connected to a fourth output A4 via a fourth transistor T4. Thus, in a first read-in process, the four first inputs E1A, E2A, E3A, E4A of the multiplexer 16 are respectively connected to one each of the outputs A1, A2, A3, A4 of the multiplexer 16, so that four analog signals which are present at the four first inputs E1A, E2A, E3A, E4A of the multiplexer 16 can be switched through to the four analog inputs AIN1, AIN2, AIN3, AIN4 of the ASIC component 12 and can be read in. In a second read-in process, the four second inputs E1B, E2B, E3B, E4B of the multiplexer 16 are respectively connected to one each of the outputs A1, A2, A3, A4 of the multiplexer 16, so that four further analog signals which are present at the four second inputs E1B, E2B, E3B, E4B of the multiplexer 16 can be switched through to the four analog inputs AIN1, AIN2, AIN3, AIN4 of the ASIC component 12 and can be read in. This means that the multiplexer function 14 of the ASIC component 12 repeatedly activates the read-in function of the analog inputs AIN1, AIN2, AIN3, AIN4 until analog signals present at the inputs E1A, E2A, E3A, E4A, E1B, E2B, E3B, E4B of the multiplexer 16 are read in. The number of analog signals to be read in can thus be increased from four to eight.

In the shown embodiment example of the circuit arrangement 10, the read-in function includes a diagnostic function for error detection.

As can further be seen from FIG. 2, in the shown embodiment example of the circuit arrangement 10, the number of outputs A1, A2, A3, A4 of the multiplexer 16 corresponds to the number of analog inputs AIN1, AIN2, AIN3, AIN4 of the ASIC component 12. This allows eight analog signals to be read in via the four analog inputs AIN1, AIN2, AIN3, AIN4 of the ASIC component 12. If only seven analog signals are to be read in via the four analog inputs AIN1, AIN2, AIN3, AIN4 of the ASIC component 12, a multiplexer comprising six inputs E1A, E2A, E3A, E1B, E2B, E3B and three outputs A1, A2, A3 can be used, wherein only three analog inputs AIN1, AIN2, AIN3 of the ASIC component 12 are respectively connected to one of the outputs A1, A2, A3 of the multiplexer, so that the ASIC component 12 can read in a total of seven analog signals.

The number of inputs E1A, E2A, E3A, E4A, E1B, E2B, E3B, E4B, which can be sequentially electrically connected to the at least one output A1, A2, A3, A4 of the multiplexer 16 and the at least one analog input AIN1, AIN2, AIN3, AIN4 of the ASIC component 12, is based on a number of available analog outputs AO1, AO2, of the ASIC component 12. In the shown embodiment example, only the first analog output of the ASIC component 12 is available for controlling the multiplexer 16, so that only two inputs E1A, E2A, E3A, E4A, E1B, E2B, E3B, E4B can be connected to the respective output A1, A2, A2, A4. A second analog output AO2 of the ASIC component 12 is used to output an analog signal.

What is claimed is:

1. A circuit arrangement for a control unit of a vehicle, comprising:
   at least one ASIC component includes at least one analog input and at least one analog output; and
   at least one multiplexer which includes at least one output that is electrically connected to the at least one analog input and at least two inputs and is configured to electrically connect one of the at least two inputs to the at least one output as a function of at least one control signal, wherein the at least one ASIC component has a multiplexer function which is configured to generate the at least one control signal and to output the at least one control signal via the at least one analog output to at least one control input of the at least one multiplexer.

2. The circuit arrangement according to claim 1, wherein the multiplexer function is further configured to repeatedly activate a read-in function of the at least one analog input until analog signals present at the at least two inputs of the multiplexer are read in.

3. The circuit arrangement according to claim 2, wherein the read-in function includes a diagnostic function for error detection.

4. The circuit arrangement according to claim 1, wherein a number of outputs of the multiplexer corresponds to a number of analog inputs of the ASIC component.

5. The circuit arrangement according to claim 1, wherein a number of inputs which can be sequentially electrically connected to the at least one output of the multiplexer and the at least one analog input of the ASIC component, is based on a number of available analog outputs of the ASIC component.

6. The circuit arrangement according to claim 1, wherein the multiplexer is a discrete transistor network or an integrated circuit.

7. A control unit for a vehicle, comprising:
   an evaluation and control unit; and
   at least one ASIC circuit arrangement, including:
      at least one ASIC component includes at least one analog input and at least one analog output, and
      at least one multiplexer which includes at least one output that is electrically connected to the at least one analog input and at least two inputs and is configured to electrically connect one of the at least two inputs to the at least one output as a function of at least one control signal, wherein the at least one ASIC component has a multiplexer function which is configured to generate the at least one control signal and to output the at least one control signal via the at least one analog output to at least one control input of the at least one multiplexer;
   wherein the evaluation and control unit is electrically connected to at least one control input of the ASIC component of the ASIC circuit arrangement.

* * * * *